United States Patent
Ippatapu et al.

(10) Patent No.: US 10,521,317 B1
(45) Date of Patent: Dec. 31, 2019

(54) COMPRESSING DATA TO BE REPLICATED UTILIZING A COMPRESSION METHOD SELECTED BASED ON NETWORK BEHAVIOR

(71) Applicant: EMC IP Holding Company LLC, Hopkinton, MA (US)

(72) Inventors: Venkata L.R. Ippatapu, Westborough, MA (US); Kenneth Dorman, West Brookfield, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 169 days.

(21) Appl. No.: 15/794,613

(22) Filed: Oct. 26, 2017

(51) Int. Cl.
*G06F 11/20* (2006.01)
*H04L 29/08* (2006.01)
*H03M 13/00* (2006.01)

(52) U.S. Cl.
CPC ..... *G06F 11/2066* (2013.01); *H03M 13/6312* (2013.01); *H04L 67/1095* (2013.01); *H04L 67/1097* (2013.01)

(58) Field of Classification Search
CPC ............ G06F 11/2066; H03M 13/6312; H04L 67/1095; H04L 67/1097
USPC ....................................................... 711/154
See application file for complete search history.

(56) References Cited

U.S. PATENT DOCUMENTS

| | | |
|---|---|---|
| 7,444,464 B2 | 10/2008 | Urmston et al. |
| 8,095,726 B1 | 1/2012 | O'Connell et al. |
| 8,214,612 B1 | 7/2012 | Natanzon |
| 9,385,749 B1 * | 7/2016 | Nam .................... H03M 7/6082 |
| 9,606,870 B1 | 3/2017 | Meiri et al. |
| 9,716,754 B2 | 7/2017 | Swift |
| 2008/0279462 A1 | 11/2008 | Celi, Jr. |
| 2009/0132955 A1 | 5/2009 | Garg et al. |
| 2010/0179941 A1 | 7/2010 | Agrawal et al. |
| 2013/0325824 A1 | 12/2013 | Shoens |
| 2014/0181016 A1 | 6/2014 | Whitehead et al. |
| 2016/0150012 A1 | 5/2016 | Barszczak et al. |
| 2016/0202927 A1 | 7/2016 | Klarakis et al. |
| 2016/0224259 A1 | 8/2016 | Ahrens et al. |

* cited by examiner

*Primary Examiner* — Hua J Song
(74) *Attorney, Agent, or Firm* — Ryan, Mason & Lewis, LLP

(57) ABSTRACT

An apparatus comprises a first storage system comprising a plurality of storage devices. The first storage system is configured to participate in a replication process with a second storage system. The first storage system is further configured to identify data to be replicated to the second storage system as part of the replication process, to obtain information characterizing network behavior of at least one network connecting the first storage system to the second storage system, to select a compression method from a set of available compression methods based on the obtained information characterizing the network behavior of said at least one network, to compress the data to be replicated to the second storage system utilizing the selected compression method, and to provide the compressed data to the second storage system.

20 Claims, 15 Drawing Sheets

| Metric | Value | Rank | Description |
|---|---|---|---|
| Packet loss and re-transmissions | Packet loss > Packet loss threshold Or Retransmits > Retransmit Threshold | 0 | Choose the best compression ratio method |
| RTT | 0 < RTT < 5 | 3 | Choose the second highest compression rate method |
| RTT | 5 ≤ RTT < 10 | 2 | Choose the third highest compression rate method |
| RTT | 10 ≤ RTT < 15 | 1 | Choose the fourth highest compression rate method |
| RTT | RTT ≥ 15 | 0 | Choose the best compression ratio method |
| No packet loss and RTT = 0 | Throughput ≤ Available bandwidth | 4 | Choose the best compression rate method |

| Method | Compression Rate (bytes/second) | Compression Ratio |
|---|---|---|
| Compression Method 1 | R1 | A |
| Compression Method 2 | R2 | B |
| Compression Method 3 | R3 | C |
| ... | ... | ... |
| Compression Method N-1 | R(N-1) | D |
| Compression Method N | RN | E |

FIG. 7

| Method | Compression Rate | Compression Ratio |
|---|---|---|
| Compression method 1 | 100 MB/s | 25:1 |
| Compression method 2 | 200 MB/s | 15:1 |
| Compression method 3 | 300 MB/s | 10:1 |
| Compression method 4 | 400 MB/s | 5:1 |

FIG. 10

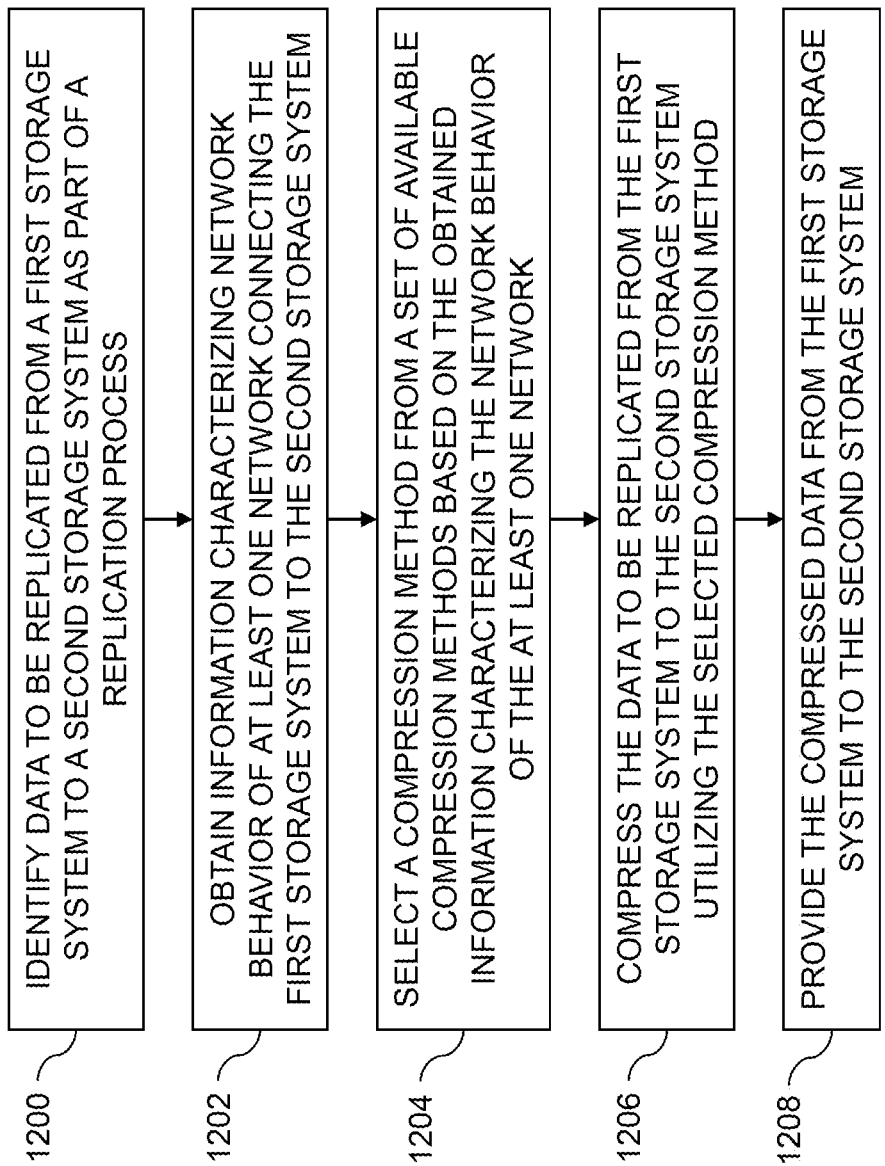

US 10,521,317 B1

COMPRESSING DATA TO BE REPLICATED UTILIZING A COMPRESSION METHOD SELECTED BASED ON NETWORK BEHAVIOR

FIELD

The field relates generally to information processing systems, and more particularly to storage in information processing systems.

BACKGROUND

Many information processing systems are configured to replicate data from a storage system at one site to a storage system at another site. In some cases, such arrangements are utilized to support disaster recovery functionality within the information processing system. For example, an enterprise may replicate data from a production data center to a disaster recovery data center. In the event of a disaster at the production site, applications can be started at the disaster recovery site using the data that has been replicated to that site so that the enterprise can continue its business.

SUMMARY

Illustrative embodiments provide techniques for network behavior controlled dynamic selection of a compression method for data that is to be replicated from a first storage system to a second storage system. Such embodiments can advantageously provide significantly improved efficiency in replication processes, reducing compression latency and network latency thus reducing consumption of computational and network resources, and are therefore better able to achieve desired performance for replication processes within an information processing system.

In one embodiment, an apparatus comprises a first storage system comprising a plurality of storage devices. The first storage system is configured to participate in a replication process with a second storage system. The first storage system is further configured to identify data to be replicated to the second storage system as part of the replication process, to obtain information characterizing network behavior of at least one network connecting the first storage system to the second storage system, to select a compression method from a set of available compression methods based on the obtained information characterizing the network behavior of said at least one network, to compress the data to be replicated to the second storage system utilizing the selected compression method, and to provide the compressed data to the second storage system.

These and other illustrative embodiments include, without limitation, apparatus, systems, methods and processor-readable storage media.

BRIEF DESCRIPTION OF THE DRAWINGS

FIG. 5 shows an example of a network monitoring unit look-up table in an illustrative embodiment.

FIG. 7 shows an example of a data compression unit logic look-up table in an illustrative embodiment.

FIG. 10 shows an example of a data compression unit logic look-up table in an illustrative embodiment.

FIG. 12 is a flow diagram of a process for network behavior controlled data compression for remote data facility replication in an illustrative embodiment.

DETAILED DESCRIPTION

Figure 1:
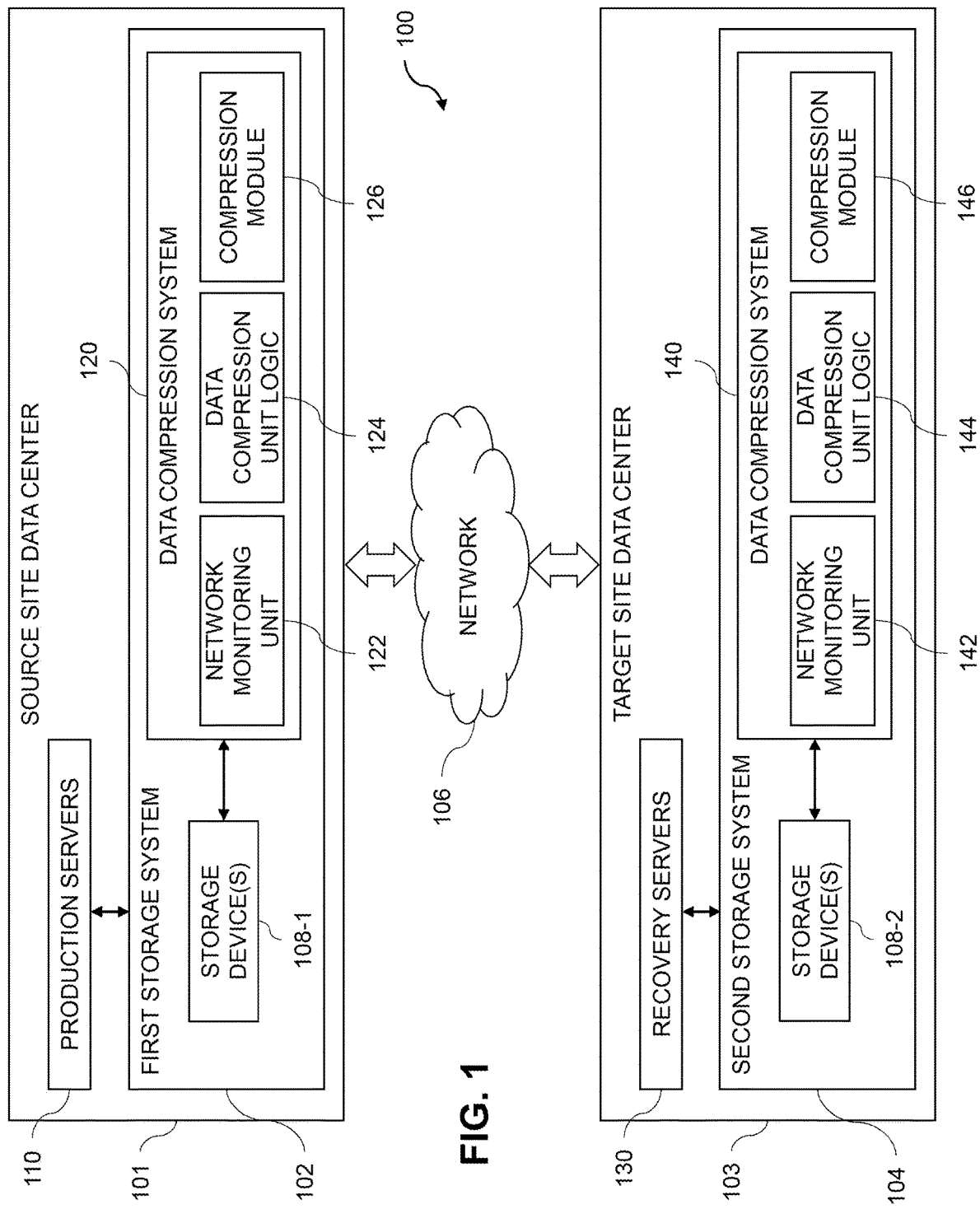
FIG. 1 is a block diagram of an information processing system comprising first and second storage systems configured for remote data facility replication with network behavior controlled data compression in an illustrative embodiment.

Illustrative embodiments will be described herein with reference to exemplary information processing systems and associated computers, servers, storage devices and other processing devices. It is to be appreciated, however, that these and other embodiments are not restricted to the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other cloud-based system that includes one or more clouds hosting multiple tenants that share cloud resources. Numerous other types of enterprise computing and storage systems are also encompassed by the term "information processing system" as that term is broadly used herein.

As discussed above, many information processing systems are configured to replicate data from a storage system at one site to a storage system at another site, to provide various features including by way of example supporting disaster recovery functionality within such information processing systems. In some cases, an information processing system may implement a Remote Data Facility (RDF) replication system, where host data is copied from a "primary," "local" or first storage system in one location to a "remote" or second storage system located at a different location for disaster recovery and fault tolerance. The primary and remote storage systems, in some cases, may be geographically remote from one another but this is not a requirement. The primary and remote storage systems, also referred to as local and remote peers, respectively, are typically connected over a global network such as through Ethernet. Improvements in Transmission Control Protocol/

Internet Protocol (TCP/IP) network performance have not matched the improvements in processing performance (e.g., in central processing unit (CPU) performance, CPU speed, etc.). Thus, network performance is in many cases the bottleneck that undermines RDF system performance, as RDF replication modules are capable of driving data throughput greater than the network can handle.

Data compression is one solution to increase host data throughput by reducing the amount of data being dispatched onto the network. Data can be compressed either by enabling software compression or hardware compression. The compression module which performs replication data compression operations introduces latency, both in performing compression and decompression operations.

The underlying global network connecting primary and secondary data storage systems introduces network latency (e.g., round trip time (RTT) latency, packet drops, packet timeouts, re-transmits, etc.) that can degrade the performance of the RDF replication system. The network shortcomings can highly degrade the performance of RDF systems. Such shortcomings are further worsened for "jumbo" frames, or Ethernet frames with payload greater than a standard maximum transmission unit (MTU) (e.g., an Ethernet frame with more than 1500 bytes of payload, the MTU specified in the IEEE 802.3 standard).

Some replication systems use a simple arrangement, wherein a static or same compression method is used for all data dispatched to the network. The overall performance of the host Input/Output (I/O) operations, however, suffers in such cases as the overall network behavior (e.g., RTT, available bandwidth, packet loss, etc.) is not considered. Thus, approaches which implement a single fixed compression method for data compression without considering underlying network behavior do not provide optimal performance.

Embodiments provide various improvements for data replication, such as in RDF replication between local and remote peers connected via Ethernet over a global network, by intelligently controlling the compression method applied to replication data that needs to be compressed before being dispatched to the network. Network monitoring is used to identify various network metrics, and data compression logic is introduced to dynamically select from a set of available compression methods to provide an optimal compression rate and compression ratio based on the identified network metrics to reduce overall I/O latency. While described primarily herein with regards to RDF replication, embodiments are not so limited. Instead, embodiments more generally may be applicable to or extended for any host application to optimally select amongst available compression methods based on host use case requirements. In some cases, embodiments can significantly reduce network data than approaches which utilize a single compression method without regard for network behavior, and can greatly reduce network bandwidth usage. In some cases, embodiments can significantly increase the data throughput more than approaches which utilize a single compression method without regard for network behavior.

RDF Replication Systems, such as the Symmetrix Remote Data Facility (SRDF®) solutions for VMAX® products from Dell EMC of Hopkinton, Mass., copy data from one storage system to one or more additional storage systems. Thus, in the case of disaster or failure at a local storage system which renders the local storage inaccessible, the data copied to one or more other remote storage systems may be used to resume operations and retrieve the stored data therefore providing persistent storage operations.

The time that elapses between when a host issues an I/O operation to a storage system and when the I/O operation completes is experienced as I/O latency by the host. I/O latency is an important performance consideration for storage systems.

Compression hardware or software compression may be embedded onto storage systems, such that the storage systems are configured to send compressed data on a network to reduce network bandwidth usage on congested networks. The compression hardware or software compression may be capable of performing various types of compression methods, including by way of example compression methods such as Lempel-Ziv (LZ), Lempel-Ziv-Stac (LZS), Deflate, Huffman, etc. Different compression methods can have different characteristics, such as differing compression rates or compression ratios. In some cases, a compression method such as LZ, LZS, Deflate or Huffman may have different compression rates or compression ratios which depend on configuration parameters for the compression methods. Compression ratio is the ratio between the uncompressed size and the compressed size of data. Generally, the greater the compression ratio of a given compression method, the greater is the latency (or compression rate) of the given compression method as the compression hardware or software consumes more time to compress the data but is not restricted always. Different compression methods have different latencies, compression rates and compression ratios. The overall I/O latency may include processing overhead on a local storage system, compression latency at the local storage system, network latency, decompression latency at a remote storage system, and processing overhead on the remote storage system.

I/O latency can determine the overall performance of an RDF replication system. As discussed above, network latency may be a large contributing factor to the I/O latency, and thus can play a key role in determining performance of an RDF replication system. An inappropriate compression method can result in increasing compression/decompression latency at local and remote storage systems, as well as contributing to network latency harming overall performance. To overcome these disadvantages, embodiments may configure compression modules that handle compression for local and remote storage systems to dispatch data to a network connecting the local and remote storage systems (or to network output buffers) quickly if the network is not bandwidth bounded. Compression modules may be further configured to compress data as much as possible if the network is highly congested, when RTT of packets is large, etc. Compression modules may be further configured to dynamically control data compression in between such extremes based on network behavior.

Compression approaches which statically choose compression methods without taking into account network behavior can result in added compression latency and network latency for compression-enabled I/O operations. To reduce overall I/O latency, it is thus desirable to choose a best compression method from a set of available compression methods to provide an optimal compression rate and compression ratio for data in response to changes in network behavior.

FIG. 1 shows an information processing system 100 configured in accordance with an illustrative embodiment. The information processing system 100 comprises a first storage system 102 and a second storage system 104. The first storage system 102 is also referred to herein as a local storage system, while the second storage system 104 is also referred to herein as a remote storage system. The first storage system 102 and the second storage system 104 communicate over network 106 to implement Remote Data Facility (RDF) replication.

The first storage system 102 and the second storage system 104 illustratively comprise respective processing devices of one or more processing platforms to implement data compression system 120 and data compression system 140, respectively. Such processing devices may comprise respective virtual machines (VMs) each having a processor and a memory, although numerous other configurations are possible.

The storage system 102 and storage system 104 can additionally or alternatively be part of cloud infrastructure such as an Amazon Web Services (AWS) system. Other examples of cloud-based systems that can be used to provide storage system 102 and storage system 104 and possibly other portions of system 100 include Google Cloud Platform (GCP) and Microsoft Azure.

The network 106 is assumed to comprise a portion of a global computer network such as the Internet, although other types of networks can be part of the network 106, including a wide area network (WAN), a local area network (LAN), a satellite network, a telephone or cable network, a cellular network, a wireless network such as a WiFi or WiMAX network, or various portions or combinations of these and other types of networks. The network 106 in some embodiments therefore comprises combinations of multiple different types of networks each comprising processing devices configured to communicate using Internet Protocol (IP) or other communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

The first storage system 102 includes one or more storage devices 108-1, and the second storage system 104 includes one or more storage devices 108-2. Any desired number of storage devices 108-1, 108-2 may be included in the first storage system 102 and the second storage system 104, respectively, as desired. Illustratively, data stored in the storage devices 108-1 of the first storage system 102 is replicated in the storage devices 108-2 of the second storage system 104 so as to implement an RDF replication system.

The storage devices 108-1, 108-2 may comprise solid state drives (SSDs) implemented using non-volatile memory (NVM) devices such as flash memory. Other types of NVM devices that can be used to implement at least a portion of the storage devices 108-1 and 108-2 include non-volatile random access memory (NVRAM), phase-change RAM (PC-RAM) and magnetic RAM (MRAM). Various combinations of multiple different types of NVM devices may also be used.

However, it is to be appreciated that other types of storage devices can be used in other embodiments. For example, a given storage system as the term is broadly used herein can include a combination of different types of storage devices, as in the case of a multi-tier storage system comprising a flash-based fast tier and a disk-based capacity tier. In such an embodiment, each of the fast tier and the capacity tier of the multi-tier storage system comprise a plurality of storage devices with different types of storage devices being used in different ones of the storage tiers. For example, the fast tier may comprise flash drives while the capacity tier comprises hard disk drives. The particular storage devices used in a given storage tier may be varied in other embodiments, and multiple distinct storage device types may be used within a single storage tier. The term "storage device" as used herein is intended to be broadly construed, so as to encompass, for example, flash drives, solid state drives, hard disk drives, hybrid drives or other types of storage devices.

In some embodiments, one or both of the first storage system 102 and the second storage system 104 comprise storage arrays such as VNX® and Symmetrix VMAX® storage arrays from Dell EMC of Hopkinton, Mass. Other types of storage arrays, including by way of example XtremIO™ storage arrays also from Dell EMC, can be used to implement storage systems in other embodiments.

The term "storage system" as used herein is therefore intended to be broadly construed. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing a given storage system in an illustrative embodiment include all-flash and hybrid flash storage arrays such as Unity™, software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

The first storage system 102 and the second storage system 104 in the FIG. 1 embodiment are assumed to be implemented using at least one processing platform each comprising one or more processing devices each having a processor coupled to a memory. Such processing devices can illustratively include particular arrangements of compute, storage and network resources. For example, processing devices in some embodiments are implemented at least in part utilizing virtual resources such as VMs or Linux containers (LXCs), or combinations of both as in an arrangement in which Docker containers or other types of LXCs are configured to run on VMs. In some embodiments, the first storage system 102 and the second storage system 104 are implemented on respective distinct processing platforms. In other embodiments, at least portions of the first storage system 102 and the second storage system 104 are implemented on a same processing platform.

As a more particular example, the data compression system 120 and/or the data compression system 140 can be implemented in the form of one or more LXCs running on one or more VMs. Other arrangements of one or more processing devices of a processing platform can be used to implement the data compression system 120 and/or the data compression system 140. Other portions of the system 100 can similarly be implemented using one or more processing devices of at least one processing platform.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the cluster reside in one or more other data centers in one or more other geographic locations that are potentially remote from the first geographic location. Thus, it is possible in some implementations of the system 100 for the first storage system 102 and the second storage system 104 to reside in different data centers that are geographically remote, although this is not a requirement. Numerous other distributed implementations of one or both of the first storage system 102 and the second storage system 104 are possible. Accordingly, each of the first storage system 102 and the second storage system 104 can also be implemented in a distributed manner across multiple data centers.

It is to be appreciated that these and other features of illustrative embodiments are presented by way of example only, and should not be construed as limiting in any way.

As shown in FIG. 1, the data compression system 120 of the first storage system 102 includes a network monitoring unit (NMU) module 122, a data compression unit (DCU) logic module 124 and a compression module 126. The data compression system 140 of the second storage system 104 is similarly configured with a NMU module 142, a DCU logic module 144 and a compression module 146. In some cases, as discussed above, the first storage system 102 is a local storage system while the second storage system 104 is a remote storage system. In such a configuration, the compression module 126 of the data compression system 120 compresses data sent over the network 106 to the second storage system 104, with the data compression system 140 acting as a data "decompression" system where the compression module 146 decompresses data.

In other configurations, however, the first storage system 102 may act as a "remote" storage system relative to the second storage system 104 (or another storage system not explicitly shown in FIG. 1) that acts as a "local" storage system. For example, some hosts or client devices (not explicitly shown in FIG. 1) may provide I/O requests to the first storage system 102 and data may be replicated to the second storage system 104. Other hosts or client devices may provide I/O requests to the second storage system 104, which are replicated to the first storage system 102 (or to another storage system not explicitly shown in FIG. 1). Thus, unless otherwise indicated, the NMU module 142, DCU logic module 144 and compression module 146 of the data compression system 140 may be configured in a manner similar to that described herein with respect to the NMU module 122, DCU logic module 124 and compression module 126 of data compression system 120.

It should be understood that the particular sets of modules and other components implemented in the system 100 as illustrated in FIG. 1 are presented by way of example only. In other embodiments, only subsets of these components, or additional or alternative sets of components, may be used, and such components may exhibit alternative functionality and configurations.

In the information processing system 100, the first storage system 102 and the second storage system 104 may be associated with respective source 101 and target 103 sites of a replication process. For example, the source site 101 may comprise a production site data center and the target site 103 may comprise a disaster recovery site data center, although other arrangements are possible. The source site 101 and the target site 103 may be implemented in respective distinct local and remote geographic locations, although it is possible for the two sites to be within a common facility or even be implemented on a common processing platform. It is assumed that data is replicated from the first storage system 102 of the source site 101 to the second storage system 104 of the target site 103 using a network behavior controlled data compression selection algorithm.

In order to conserve bandwidth on the network 106 between the first storage system 102 of the source site 101 and the second storage system 104 of the target site 103, data may be transferred incrementally in a cycle-based asynchronous replication process. This means that instead of sending all the data stored at the first storage system 102 of the source site 101 to the second storage system 104 of the target site 103 in each of a plurality of cycles, only the data that has been changed during each cycle may be transferred. The changed data is an example of what is more generally referred to herein as "differential data." A given set of differential data transferred from the first storage system 102 of the source site 101 to the second storage system 104 of the target site 103 in a given one of the cycles of the cycle-based asynchronous replication process represents a "delta" between a pair of source site snapshots for a corresponding pair of the cycles. Each source site snapshot captures the state at a particular point in time of the data to be replicated from the first storage system 102 of the source site 101 to the second storage system 104 of the target site 103. It is assumed that one such source site snapshot is generated in conjunction with each of the cycles of the asynchronous replication process.

A given one the cycles of the cycle-based asynchronous replication process illustratively encompasses an amount of time spent sending a corresponding one of the sets of differential data or deltas from the first storage system 102 of the source site 101 to the second storage system 104 of the target site 103. There is a lag time between the data at the source site and the replicated data at the target site. More particularly, the replicated data at the target site is "older" than the data at the source site by the lag time, as production servers 110 at the source site 101 continue to write to the first storage system 102 after the source site snapshots are taken for respective ones of the cycles. A recovery point objective or RPO in some embodiments can be specified as a maximum amount of lag time that the replicated data can have.

An advantage of transferring data incrementally from the source site 101 to the target site 103 using a cycle-based asynchronous replication process is that it conserves bandwidth on the network 106. For example, each byte of data written by the production servers 110 to the storage system 102 need only be transferred once. It is to be appreciated, however, that embodiments are not limited to use with asynchronous replication processes but instead are more generally applicable to various types of replication processes including synchronous replication processes.

Production servers 110 at source site 101 can illustratively run applications for users of the system 100. The production servers 110 are configured to store application data in the first storage system 102. This application data is illustratively part of the data that is replicated from the source site 101 to the target site 103. Recovery servers 130 at the target site 103 are configured to take up the running of the applications for the users of the system 100 in the event of a disaster recovery or other recovery situation. The applications on the recovery servers 130 of the target site 103 are started using the data that has been replicated to the second storage system 104.

The data compression system 120, as discussed above, includes NMU module 122 and DCU logic module 124. Additional details regarding these modules and more generally replication processes with network behavior controlled data compression will now be described in further detail with respect to FIGS. 2-8.

Figure 2:
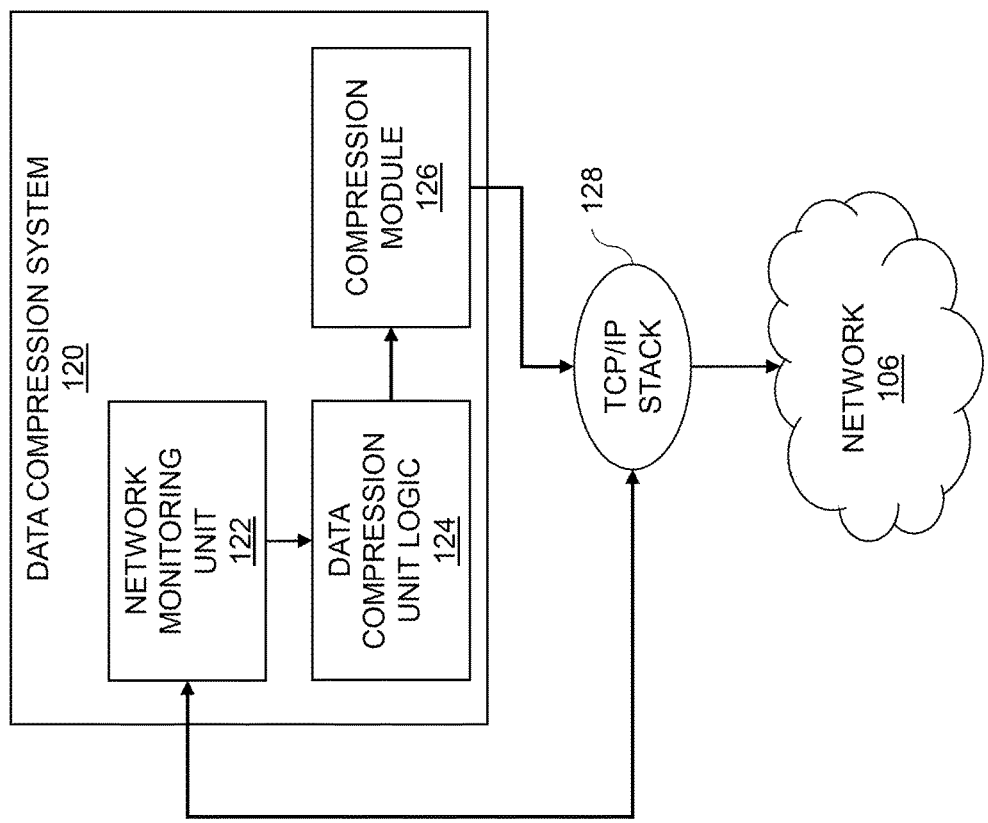
FIG. 2 is a detailed view of the first storage system of FIG. 1 in an illustrative embodiment.
Figure 3:
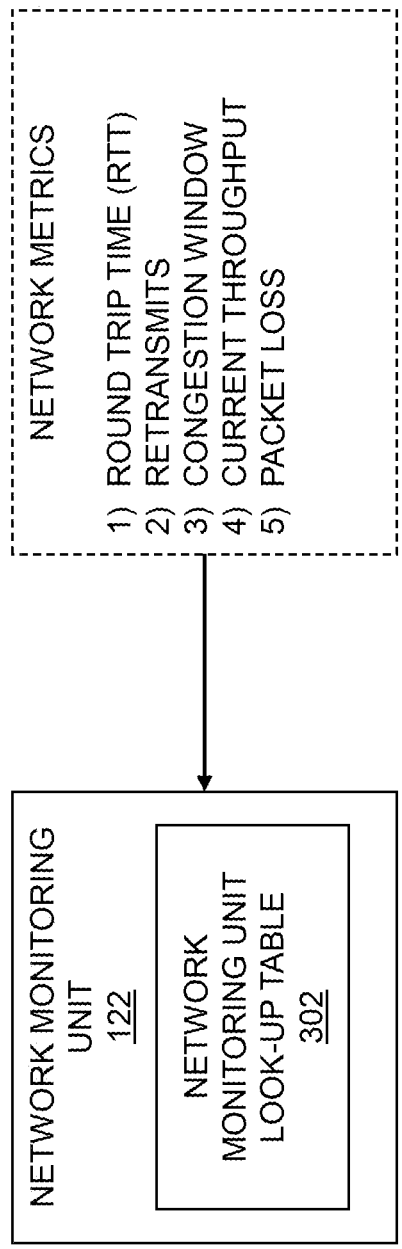
FIG. 3 is a block diagram of the network monitoring unit of the first storage system of FIG. 1 in an illustrative embodiment.

FIG. 2, for example, shows a detailed view 200 of the data compression system 120 of the first storage system 102. The data compression system 120 includes the NMU module 122, which is configured to obtain information characterizing network behavior of the network 106. In some embodiments, this includes monitoring network metrics for network 106 that are obtained from the TCP/IP stack 128. The TCP/IP stack 128 provides network protocols for the first storage system 102 to connect to the network 106, and is an example of what is more generally referred to herein as a network interface.

The NMU module 122 monitors one or more network metrics which determine performance of the network 106. In some embodiments, the NMU module 122 may monitor various TCP/IP parameters from the TCP/IP stack 128. The NMU module 122 may be programmed with a NMU look-up table (illustrated in FIGS. 3 and 5) which characterizes network performance as a "rank" based on monitored network metrics including, by way of example, RTT, retransmissions or retransmits, congestion window, current throughput, packet loss, etc. RTT refers to the time required for a signal pulse or packet to travel from a specific source to a specific destination and back again. RTT reflects the network delay on network 106. Retransmits and packet loss metrics reflect lossy network performance and the number of packet retransmits required to continue traffic. The congestion window size metric characterizes outstanding outbound data. If outstanding outbound data is greater than a send threshold, then the network 106 is congested. Otherwise, bandwidth is available to send data without being congested. The current throughput may be measured as:

TCP throughput=Congestion Window Size/RTT

Packet loss and retransmits may be monitored for each of a plurality of time intervals. The packet loss and retransmits for a current time interval T may be compared with the packet loss and retransmits of a previous time interval T-1 (or the packet loss and retransmits of two or more previous time intervals) to determine network behavior. For example, if the difference in the re-transmission count is greater than a designated threshold between intervals T and T-1, this may indicate a lossy network.

It is to be appreciated that the above-described network metrics are presented by way of example only, and that embodiments are not limited solely to use with the specific network metrics described above or shown in FIG. 3. In addition, embodiments are not required to use all of the network metrics described above and listed in FIG. 3. Instead, some embodiments may utilize only a subset of the network metrics shown, or may utilize various other network metrics in addition to or in place of one or more of the network metrics described above and listed in FIG. 3.

Figure 4:
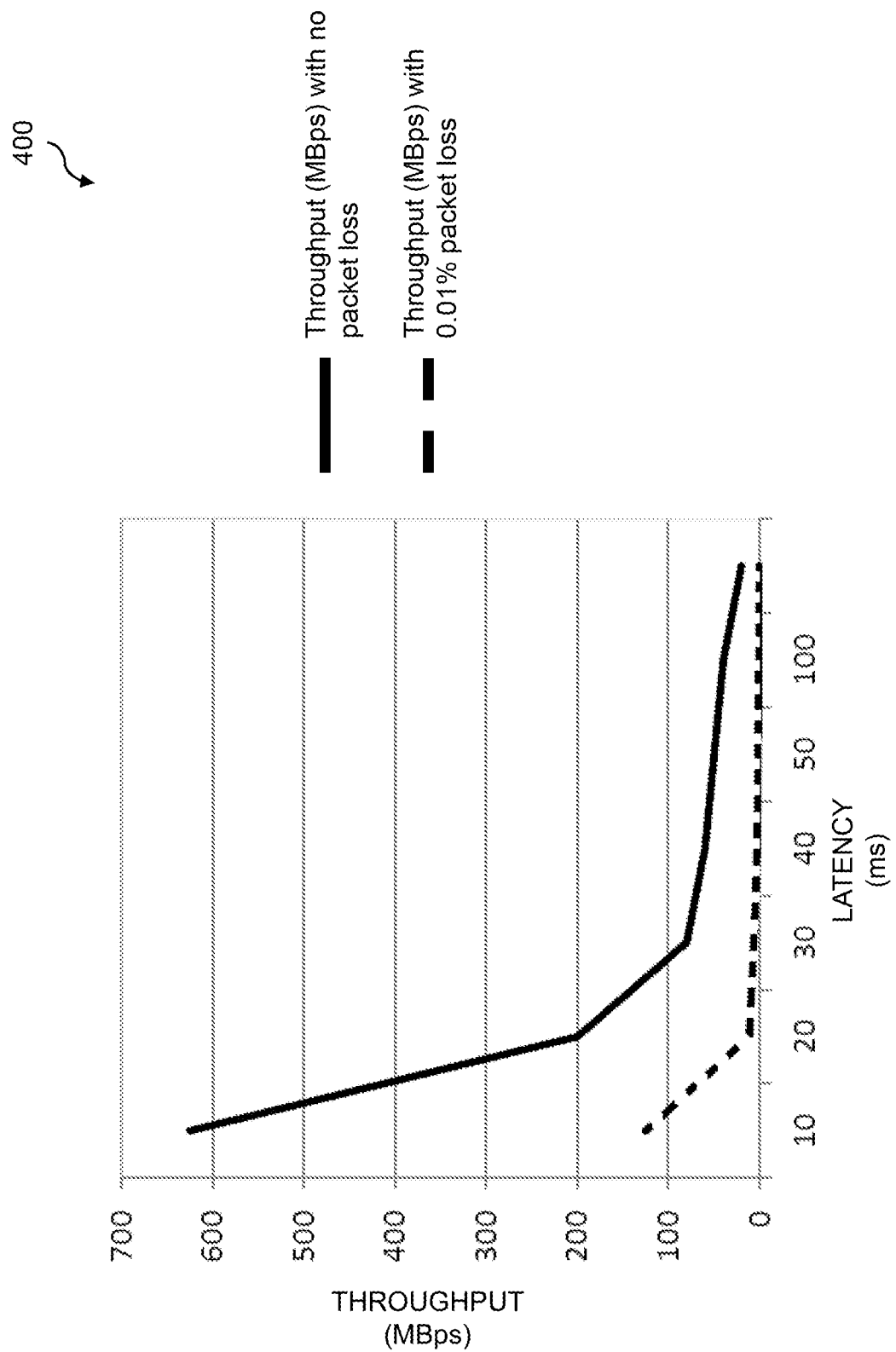
FIG. 4 is a plot of throughput versus latency in an illustrative embodiment.

FIG. 4 shows an experimental plot 400 of throughput (in Megabits per second (MBps)) versus latency (in milliseconds (ms)) on a 10 gigabit (G) capable link between a replication pair that are point-to-point connected through a network emulator. The throughput for different network latencies and packet loss were measured and plotted as shown in FIG. 4. As can be seen from the plot 400, throughput of the link drastically reduces to more than half in the first 10-15 ms of RTT delay. Throughput is further worsened if there is packet loss on the network.

Given the above, various conclusions may be drawn for compression method selection logic. For example, if there is packet loss, then the data sent to the network should be as minimal as possible to avoid retransmits and more congestion. Thus, in some embodiments a compression method with a best or highest compression ratio may be chosen for networks experiencing packet loss above some designated threshold. The relationship between RTT and throughput indicates that throughput may be reduced by more than 50% with 10-15 ms of RTT delay. Thus, in some embodiments compression methods of varying compression rate and compression ratio may be selected as the RTT delay increases, such as in discrete units of RTT. If there is no packet loss (or packet loss below some designated threshold) and the RTT is negligible (or below some designated threshold), a compression method with the best or fastest compression rate may be selected to reduce compression latency and network latency.

FIG. 5 shows an example of the NMU look-up table 302, which maps a parameter "rank" to certain designated threshold conditions for monitored network metrics. It is to be appreciated, however, that the specific thresholds and metrics used in NMU look-up table 302 are presented by way of example only, and that embodiments are not limited to use with the particular thresholds or network metrics shown in FIG. 5. The rank in the NMU look-up table 302 is used to select from available compression methods. In the FIG. 5 example, the NMU look-up table 302 uses packet loss and RTT network metrics to assign ranks. When packet loss exceeds a packet loss threshold or retransmits exceed a retransmit threshold, a rank of 0 is assigned which corresponds to selecting the compression method with the best or highest compression ratio.

For RTT, the scale of 0-15 ms is divided into four discrete units. RTT greater than zero but less than or equal to 5 ms is assigned rank 3 which corresponds to selecting the compression method with the second-highest compression rate. When RTT is greater than or equal to 5 ms but less than 10 ms, a rank of 2 is assigned which corresponds to selecting the compression method with the third-highest compression rate. When RTT is greater than or equal to 10 ms but less than 15 ms, a rank of 1 is assigned which corresponds to selecting the compression method with the fourth-highest compression rate. If RTT is greater than or equal to 15 ms, a rank of 0 is assigned, which as noted above in this example corresponds to selecting a compression method with the best compression ratio.

If there is no packet loss and the RTT is zero, this corresponds to a condition where the throughput is less than or equal to the available bandwidth. In such a scenario, a rank of 4 is assigned, which corresponds to selecting a compression method with the best or fastest compression rate.

It is again noted that the particular examples of ranks and metric thresholds shown in the example NMU look-up table 302 of FIG. 5 are presented by way of example only. In other embodiments, more or fewer ranks may be used, or the ranks may be associated with different available compression methods. Further, ranks may be assigned for values of additional network metrics not specifically shown in the FIG. 5 example.

Figure 6:
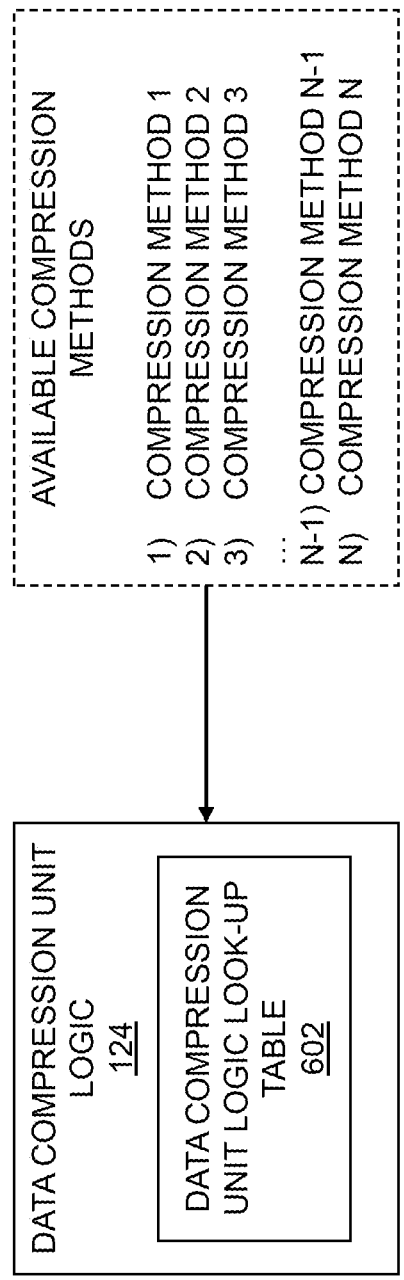
FIG. 6 is a block diagram of the data compression unit logic of the first storage system of FIG. 1 in an illustrative embodiment.

Referring back to FIG. 2, the NMU module 122 monitors the network metrics, such as utilizing information obtained from TCP/IP stack 128, and utilizes NMU look-up table 302 to map monitored network metrics to a rank. This rank may be provided from the NMU module 122 to the DCU logic module 124. FIG. 6 shows the DCU logic module 124, which may maintain a DCU logic look-up table 602 based on available compression methods. The DCU logic module 124 maintains the DCU logic look-up table 602, which characterizes available compression methods along with their average compression rate and ratios, which may be computed for several data types. Contents of the DCU logic look-up table 602 may be placed in a decreasing order of compression rate (e.g., the first entry of the DCU logic look-up table 602 corresponds to the highest compression rate method, the second entry of the DCU logic look-up table 602 corresponds to the second-highest compression rate method, etc.). Generally, greater compression ratio methods or algorithms consume a greater amount of time for compression, and thus have comparatively lower or slower compression rates.

Sorting the available compression methods by compression rate allows the DCU logic module 124 to identify a desired compression method from the DCU logic look-up table 602 with little effort (e.g., based on the rank provided by the NMU module 122 where the ranks correspond to rows in the DCU logic look-up table). Thus, the rank 0 may be mapped to a last entry (N) in the DCU logic look-up table 602 maintained by the DCU logic module 124, the rank 1 may be mapped to a second-to-last entry in the DCU logic look-up table 602, and so one, with the rank 4 being mapped to the first entry in the DCU logic look-up table 602.

It should be noted that the above description assumes that the number of ranks does not exceed the number of available compression methods. This, however, is not a requirement. There may be more ranks than available compression methods, or vice versa. Further, while the ordering of entries in the DCU logic look-up table 602 described above allows the DCU logic module 124 to identify an appropriate compression method with little effort, this ordering is not required. More generally, the DCU logic module 124 is configured to use the rank provided by the NMU 122 to select an appropriate compression method (e.g., with a desired compression rate and/or compression ratio) based on the monitored network behavior (e.g., based on the needs of the underling TCP/IP network).

In some embodiments, the DCU logic module 124 may maintain multiple DCU logic look-up tables. Different compression methods, for example, may exhibit varying performance based on the type of data to be compressed. It may be desired to maintain separate DCU logic look-up tables for different types of data with the above-described ordering of available compression methods. Thus, given data to be compressed of a particular type, the DCU logic module 124 can select a DCU logic look-up table corresponding to that data type and easily identify the desired compression method (e.g., based on the rank provided by the NMU module 122). Alternatively, such information may be included in a single DCU logic look-up table with additional entries that characterize compression method performance based on the data type to be compressed.

The available compression methods may be those that are supported by compression hardware or software of the data compression system 120. In the FIG. 6 example, there are N available compression methods denoted compression method 1, compression method 2, compression method 3, . . . , compression method N−1, compression method N.

FIG. 7 shows an example of the DCU logic look-up table 602, where each of the available compression methods has an associated compression rate (measured in bytes/second) and a compression ratio. For example, compression method 1 has compression rate R1 and compression ratio A, compression method 2 has compression rate R2 and compression ratio B, etc. Specific examples of compression methods with different compression rates and ratios will be described in further detail below with respect to FIG. 10.

Advantageously, the table look-up operations of the NMU module 122 and the DCU logic module 124 may be considered "cheap" from a computing resource standpoint (e.g., such operations are central process unit (CPU) inexpensive). In addition, such table look-up operations do not add (or add minimal) extra latency since TCP/IP parameters are readily available from the TCP/IP stack 128.

Referring back to FIG. 2, the DCU logic module 124 provides an identification of the selected compression method to the compression module 126. The compression module 126 compresses the data utilizing the selected compression method, and provides the compressed data over the network 106 to the second storage system 104. The compression module 126, in some embodiments, appends a compression header to the beginning of the compressed data. The compression header includes the compression method information (e.g., it identifies the compression method or algorithm used to compress the data). The compression module 146 of the second storage system 104 can read the compression header to identify the compression method used to compress the data and thus decompress the data using the same method.

Figure 8:
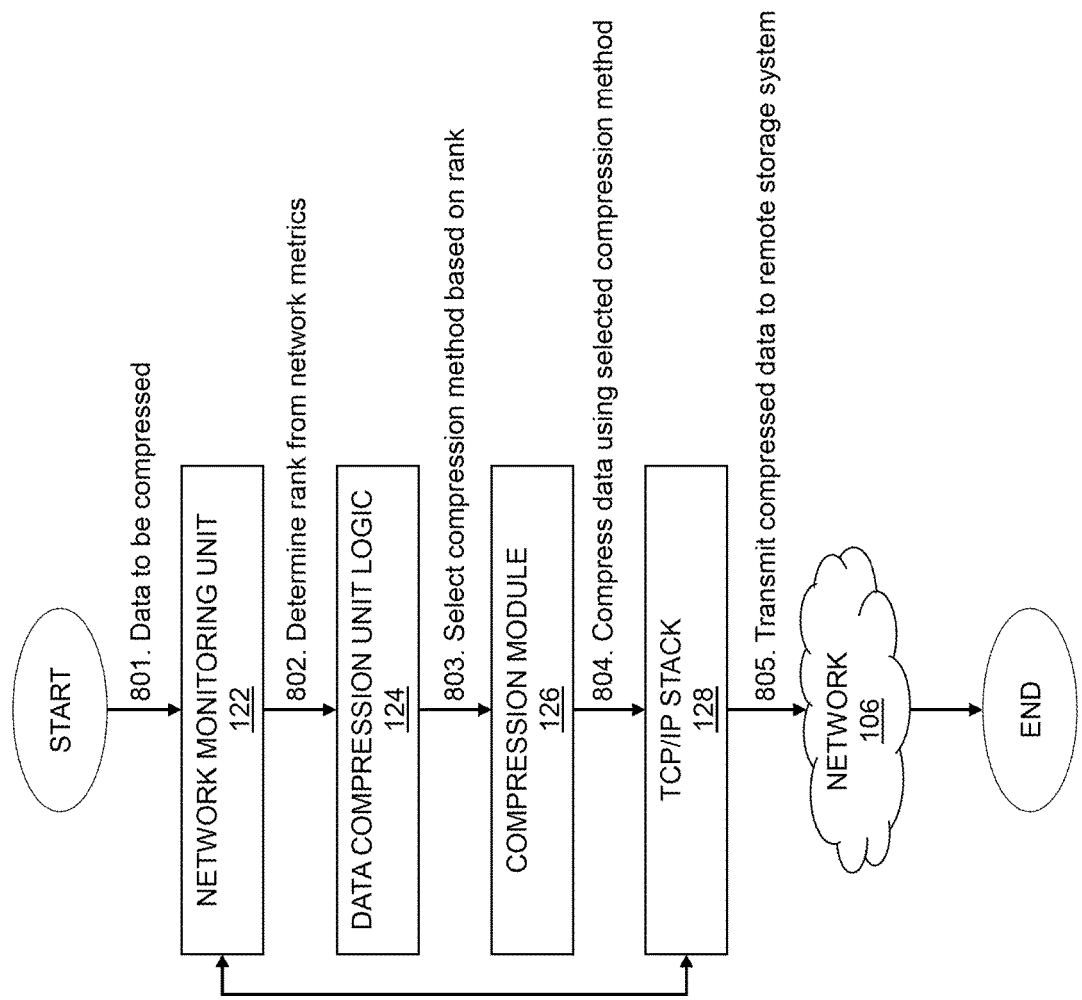
FIG. 8 shows an example flow of processing in the data compression system of the first storage system of FIG. 1 in an illustrative embodiment.

FIG. 8 shows an example flow of processing in the data compression system 120 of the first storage system 102 as described above. To start, data to be compressed is provided in step 801. The NMU module 122 determines a rank based on monitored network metrics in step 802, which is provided to the DCU logic module 124. The DCU logic module 124 selects a compression method based on the rank in step 803. The compression module 126 compresses the data using the selected compression method in step 804. The compressed data is then transmitted to the second storage system 104 in step 805 over network 106. By dynamically selecting the compression method based on network behavior as described in the FIG. 8 processing flow, reduced I/O latency is provided relative to techniques which statically choose a fixed compression method for data without considering network behavior. Further, dynamically selecting the compression method based on network behavior may achieved without introducing additional hardware or extra dependencies. Thus, existing storage systems may be suitably modified with software or logic to implement functionality of the NMU module 122 and DCU logic module 124 to provide significant improvements in I/O latency.

Figure 9:
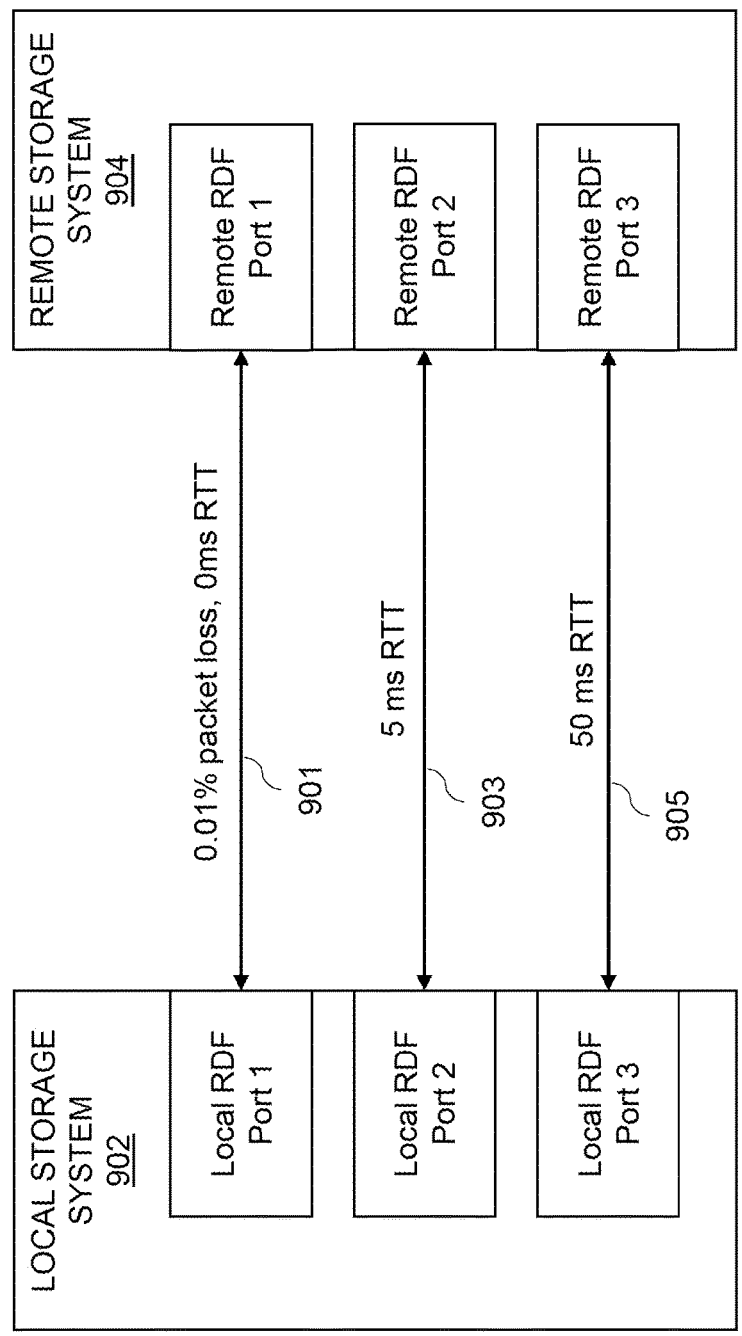
FIG. 9 is a block diagram of local and remote storage systems with multiple remote data facility ports having different network metrics in an illustrative embodiment.

FIG. 9 illustrates application of techniques which dynamically select the compression method based on network behavior in the example configuration of information processing system 900. The information processing system 900 includes a local storage system 902 and a remote storage system 904, each with three RDF ports. It is to be appreciated, however, that in other embodiments local and remote storage systems may include more or fewer than three RDF ports. The local storage system 902 may be implemented as a Symmetrix VMAX® storage system with three local RDF ports and the remote storage system 904 may be implemented as a Symmetric VMAX® system also with three remote RDF ports. Local RDF port 1 of local storage system 902 is connected to remote RDF port 1 of the remote storage system 904, with the connection 901 experiencing 0.01% packet loss. Local RDF port 2 of local storage system 902 is connected to remote RDF port 2 of the remote storage system 904, with the connection 903 experiencing 0% packet loss and 5 ms RTT. Local RDF port 3 of the local storage system 902 is connected to remote RDF port 3 of the remote storage system, with the connection 905 experiencing 0% packet loss and 50 ms RTT.

In the FIG. 9 example, it is assumed that the local storage system 902 is configured with a data compression system 120 as described above. More particularly, the local storage system 902 is assumed to be configured with a DCU logic module having the DCU logic look-up table 1000 shown in FIG. 10. The local storage system 902 is thus configured to dynamically select amongst the four compression methods having different average compression rates and compression ratios as shown in the DCU logic look-up table 1000. It is to be appreciated that the compression rates and compression ratios shown are presented by way of example to illustrate application of network behavior controlled dynamic selection of compression methods, and do not necessarily correspond to actual compression rates or ratios.

Connection 901 experiences 0.01% packet loss, meaning that 1 out of 100 packets are being dropped by the underlying network coupling the local storage system 902 to the remote storage system 904. In such situations, the peers must repeatedly retransmit the dropped packets until they are successfully transmitted. Retransmitting packets with such frequency results in additional latency, and drops overall I/O latency performance. Additionally, retransmitting jumbo data frames further causes the TCP congestion window to overflow, resulting in backing off the I/O operations at the local and remote ports. The network behavior controlled dynamic compression method selection algorithm selects a compression method with the best compression ratio method (e.g., compression method 1 in the DCU logic look-up table 1000) for connection 901 to compress data as much as possible to leave sufficient space in the TCP send window to accommodate more data, avoiding EWOULDBLOCK and ENOMEM errors, improving I/O latency. If packet loss tends to approach 0% (and assuming no other network metric such as RTT exceeds designated thresholds), the network behavior controlled dynamic compression method selection algorithm will utilize the best compression rate method (e.g., compression method 4 in the DCU logic look-up table 1000) to avoid compression latency at the compression module of the local storage system 902.

Connection 903 experiences 5 ms RTT, implying that the underlying network has little congestion and available network bandwidth is dropped by 5 ms RTT latency. For connection 903, the network behavior controlled dynamic compression method selection algorithm determines the available network bandwidth and from the observed RTT chooses an optimal compression method to avoid further network congestion and mitigate compression latency. In this case, the network behavior controlled dynamic compression method selection algorithm may select an intermediate compression method (e.g., compression method 2 in the DCU logic look-up table 1000) to optimally compress the data as much as required to improve RDF replication performance while reducing network bandwidth. As RTT approaches zero, the network behavior controlled dynamic compression method selection algorithm will select a best compression rate method (e.g., compression method 4 in the DCU logic look-up table 1000) to avoid compression latency. As the RTT increases, compression methods with higher compression ratios are selected as the monitored RTT meets certain specified thresholds (e.g., as specified in a NMU look-up table).

Connection 905 experiences 50 ms RTT, implying that the network is highly congested and that available network bandwidth is minimal. The network behavior controlled dynamic compression method selection algorithm in this case determines the available network bandwidth and from the observed RTT chooses the compression method with best compression ratio (e.g., compression method 1 in the DCU logic look-up table 1000) to dispatch as little data as possible. The data is compressed as much as possible to reduce further usage of network bandwidth. As discussed above, as RTT decreases the network behavior controlled dynamic compression method selection algorithm may progressively select compression methods with better compression rates (e.g., compression methods 2, 3 and 4 in the DCU logic look-up table 1000) to avoid compression latency.

Network behavior controlled dynamic compression method selection algorithms described herein provide a number of advantages, such as in replacing static selection of a fixed compression method for compressing data that can harm RDF replication under several conditions. Network behavior controlled dynamic compression method selection algorithms described herein fully consider network behavior to adaptively select an optimal compression method from available compression methods. Thus, compression latency of I/O requests is reduced when there is no need for compression, and a minimal amount of data is dispatched to the network when the network is congested or otherwise experiencing abnormal behavior. More generally, network behavior controlled dynamic compression method selection algorithms described herein improve the overall performance of RDF replication by selecting the best compression methods as and when needed based on observed network behavior.

Figure 11A:
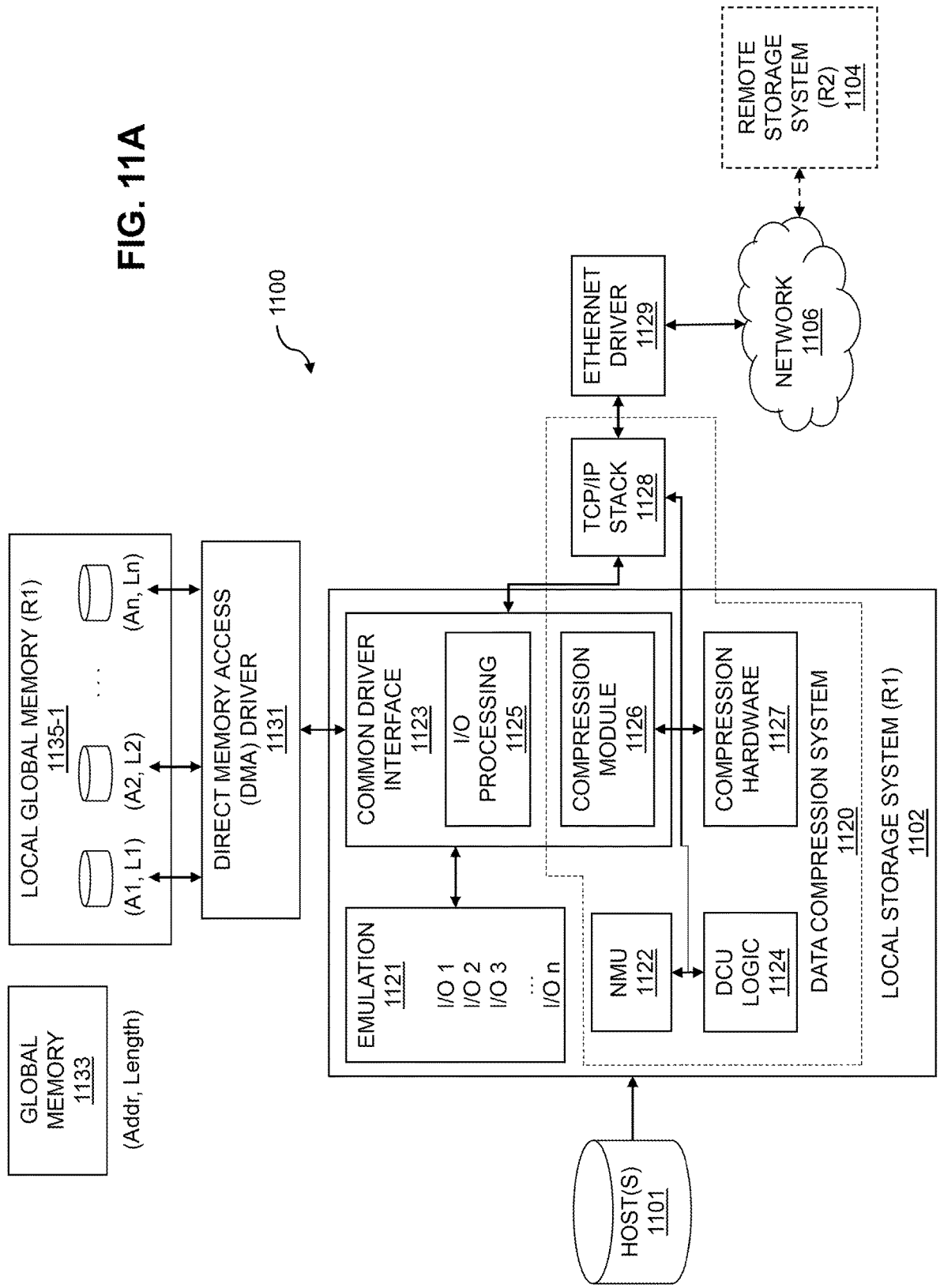
FIGS. 11A and 11B are block diagrams of another information processing system comprising local and remote storage systems configured for remote data facility replication with network behavior controlled data compression in an illustrative embodiment.
Figure 11B:
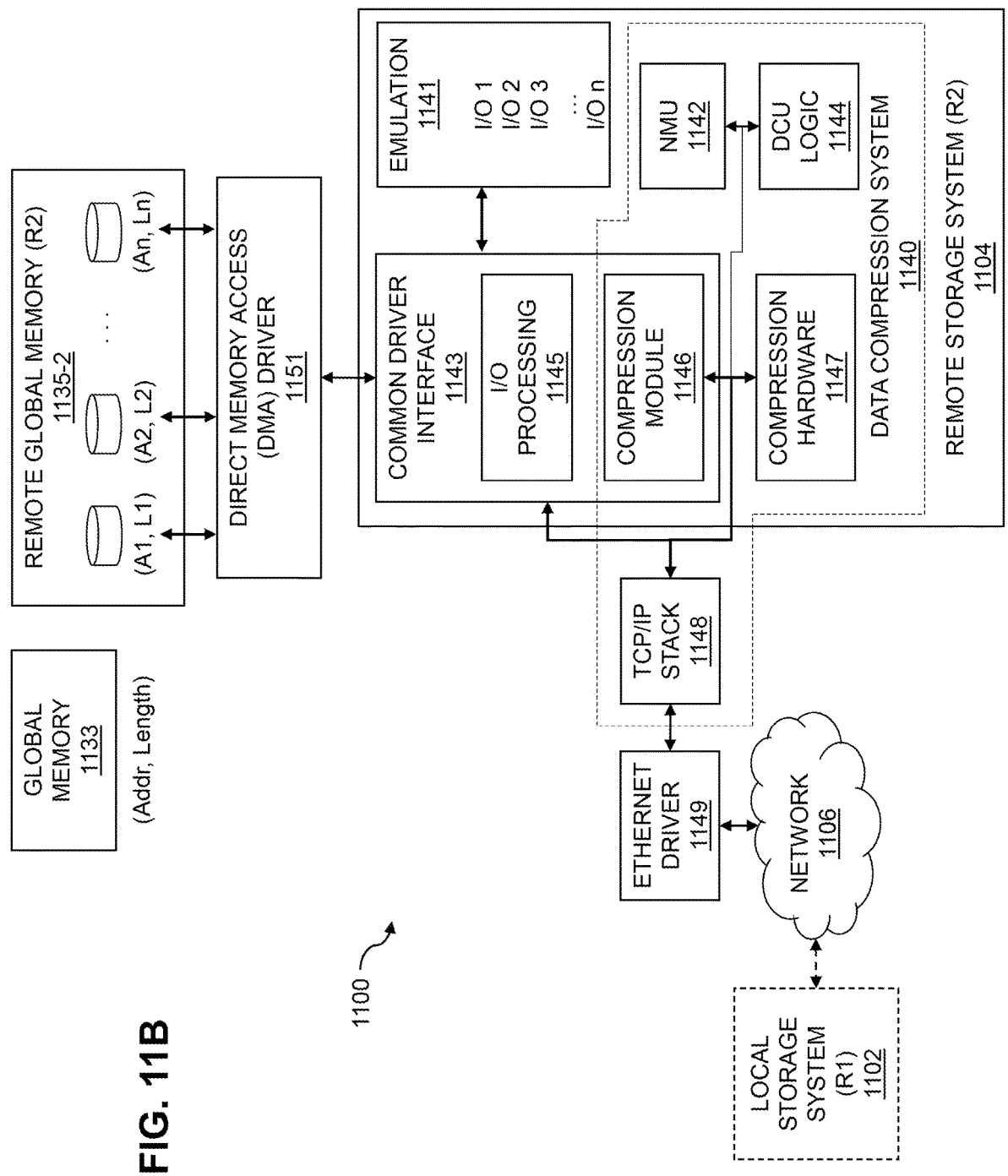

FIGS. 11A and 11B show a block diagram of an information processing system 1100 comprising a local storage system (R1) 1102 and remote storage system (R2) 1104. In the FIG. 11 embodiment, the local storage system 1102 and remote storage system 1104 are configured as Symmetrix VMAX® storage arrays implementing an SRDF® solution. One or more hosts 1101 issue I/O requests to the local storage system 1102. The local storage system 1102 and remote storage system 1104 implement a global memory 1133, which provides memory as a shared resource accessible to each processor and I/O stream in system 1100. The global memory 1133 in this embodiment is implemented in accordance with a distributed global memory model, with local global memory (R1) 1135-1 at the local storage system 1102 and local global memory (R2) 1135-2 at the remote storage system 1104. Local portions 1135-1 and 1135-2 of the global memory 1133 are accessed directly by the local storage system 1102 and remote storage system 1104, respectively. Remote portions of the global memory may be accessed through a Virtual Matrix Interconnect (e.g., the local storage system 1102 may access the local global memory 1135-2 via a Virtual Matrix Interconnect).

The local storage system 1102 and the remote storage system 1104 comprise respective direct memory access (DMA) drivers 1131 and 1151 for interfacing to the local global memories 1135-1 and 1135-2. The DMA drivers 1131 and 1151, in some embodiments, may each comprise a Data Engine Driver (DEDD) for a Symmetrix VMAX® SRDF® solution.

The local storage system 1102 and the remote storage system 1104 include respective emulation modules 1121 and 1141. The emulation modules 1121 and 1141 provide software controlling the flow of data from hosts to storage, providing different emulation to understand varying host protocols. This is illustrated in FIGS. 11A and 11B, as the emulation modules 1121 and 1141 include emulation for I/O types 1, 2, 3, . . . , n. Thus, the local storage system 1102 is configured, using emulation module 1121, to understand I/O requests of varying types or protocols that are received from hosts 1101.

The local storage system 1102 and the remote storage system 1104 further include respective common driver interfaces 1123 and 1143. The common driver interfaces 1123 and 1143 provide respective I/O processing modules 1125 and 1145 and compression modules 1126 and 1146. The common driver interfaces 1123 and 1143 provide interfaces between the emulation modules 1121 and 1141 and the data compression systems 1120 and 1140.

The data compression systems 1120 and 1140 include respective NMU modules 1122 and 1142, DCU logic modules 1124 and 1144, compression modules 1126 and 1146, and TCP/IP stacks 1128 and 1148, which are configured in a manner similar to that described above with respect to the data compression system 120 and 140, NMU modules 122 and 142, DCU logic modules 124 and 144, compression modules 126 and 146, and TCP/IP stack 128. The local storage system 1102 and remote storage system 1104 are coupled to network 1106 via the respective TCP/IP stacks 1128 and 1148 and Ethernet drivers 1129 and 1149.

As shown in FIGS. 11A and 11B, the local storage system 1102 and remote storage system 1104 include respective compression hardware 1127 and 1147. The compression hardware 1127 and 1147 may comprise specialized circuitry such as application-specific integrated circuits (ASICs) or field-programmable gate arrays (FPGAs) which are configured for performing one or more of a set of available compression methods. It is to be appreciated, however, that the local storage system 1102 and the remote storage system 1104 need not include dedicated compression hardware 1127 and 1147, but instead may use software solutions for compressing data. In some cases, combinations of hardware and software compression may be used.

The operation of the information processing systems 100, 900, 1100 will now be described in further detail with reference to the flow diagram of the illustrative embodiment of FIG. 12. The process as shown includes steps 1200 through 1208, and is suitable for use in the systems 100, 900 and 1100 described herein, but is more generally applicable to other types of information processing systems in which multiple storage systems are configured to participate in a replication process.

The FIG. 12 process is assumed to be performed by a first or local storage system 102/902/1102 that is configured to participate in a replication process with a second or remote storage system 104/904/1104. The process begins with step 1200, identifying data to be replicated the first storage system to the second storage system as part of the replication process. The first and second storage systems, as described above with respect to FIG. 1, may be associated with respective source and target sites of the replication process with the source site comprising a production site data center and the target site comprising a disaster recovery site data center.

In step 1202, information characterizing network behavior of at least one network (e.g., network 106, connections 901/903/905, network 1106) connecting the first storage system to the second storage system are obtained. In some embodiments, step 1202 includes monitoring a plurality of network metrics of the at least one network. The plurality of network metrics may be compared with a plurality of network metric thresholds to determine a given rank from a hierarchy of ranks, the given rank characterizing at least one of a specified compression rate and a specified compression ratio to utilize for compressing the data to be replicated to the second storage system.

The process continues with step 1204, selecting a compression method from a set of available compression methods based on the obtained information characterizing the network behavior of the at least one network. Step 1204 in some embodiments includes selecting a given compression method having at least one of a given compression rate and a given compression ratio corresponding to at least one of the specified compression rate and the specified compression ratio of the given rank. Step 1204 may further include performing a table look-up in a logic table comprising entries for the available compression methods, the entries of the logic table being ordered by at least one of compression rate and compression ratio of the available compression methods. Entries of the logic table may be ordered to correspond to the hierarchy of ranks.

As described above, monitoring network behavior may include monitoring network metrics, or obtaining information that is used to determine or derive network metrics. In some embodiments, the network metrics include a RTT network metric characterizing a time required for a signal pulse or packet to travel from the first storage system to the second storage system and back again over the at least one network, a re-transmissions and packet loss network metric characterizing a number of packet re-transmissions required to continue traffic on the at least one network, and a congestion window size network metric characterizing outstanding outbound data from the first storage system for transmission over the at least one network. It is to be appreciated, however, that various additional or alternative network metrics or other network information may be monitored or obtained in order to characterize and rank network behavior.

In some embodiments, the given rank selected in step 1204 is a highest rank of the hierarchy of ranks having a highest compression ratio when at least one of: (i) the re-transmission and packet loss network metric indicates that the number of packet-retransmissions exceeds a specified retransmissions threshold; and (ii) the RTT metric indicates that the RTT exceeds a specified RTT threshold. The given rank may comprise a lowest rank of the hierarchy of ranks having a highest compression rate when a current network throughput on the at least one network is less than available bandwidth on the at least one network, the current network throughput being determined based on the congestion window size network metric. The given rank may comprise one of a successive number of ranks of the hierarchy of ranks associated with successive increased compression rates as the RTT network metric indicates that the RTT exceeds corresponding successive specified RTT thresholds.

The set of available compression methods may include compression methods which utilize different compression algorithms (e.g., LZ, LZS, Deflate, Huffman, etc.). The set of available compression methods may also include two different configurations of the same compression algorithm. For example, certain compression algorithms may be associated with configuration parameters which affect their respective compression rate and/or compression ratio. Such differently-configured versions of the same compression algorithm may be viewed as different ones of the available compression methods.

The process continues with step 1206, compressing the data to be replicated to the second storage system utilizing the selected compression method. Step 1206, in some embodiments, includes appending or otherwise associating a compression header to the compressed data, the compression header identifying the selected compression method. The process concludes with step 1208, providing the compressed data to the second storage system.

The particular processing operations and other system functionality described in conjunction with the flow diagram of FIG. 12 are presented by way of illustrative example only, and should not be construed as limiting the scope of the disclosure in any way. Alternative embodiments can use other types of processing operations involving network behavior dynamic compression method selection. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different network behavior controlled data compression method selection algorithms, such as for different RDF ports coupling two storage systems together, or for different sets of replicated data or for different storage systems or portions thereof within a given information processing system.

Functionality such as that described in conjunction with the flow diagram of FIG. 12 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

Illustrative embodiments of information processing systems implementing network behavior controlled dynamic compression method selection algorithms as disclosed herein can provide a number of advantages relative to conventional arrangements as described herein. For example, some embodiments can advantageously provide significantly improved efficiency in data replication processes carried out between a source site and a target site of a given information processing system. Also, illustrative embodiments can reduce consumption of computational resources and network resources, and are therefore better able to achieve desired recovery point objectives within the information processing system.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

As mentioned previously, at least portions of the information processing systems 100, 200, 900 and 1100 may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform that may be used to implement at least a portion of an information processing system comprise cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as storage systems 102, 104, 902, 904, 1102, 1104, or portions thereof, are illustratively implemented for use by tenants of such a multi-tenant environment.

As mentioned previously, cloud infrastructure as disclosed herein can include cloud-based systems such as AWS, GCP and Microsoft Azure. Virtual machines provided in such systems can be used to implement at least portions of one or more of a local and remote or more generally first and second storage systems in illustrative embodiments. These and other cloud-based systems in illustrative embodiments can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of LXC. The containers may run on virtual machines in a multi-tenant environment, although other arrangements are possible. The containers may be utilized to implement a variety of different types of functionality within the systems 100, 200, 900 or 1100. For example, containers can be used to implement respective processing devices providing compute and/or storage services of a cloud-based system. Again, containers may be used in combination with other virtualization infrastructure such as virtual machines implemented using a hypervisor.

Illustrative embodiments of processing platforms will now be described in greater detail with reference to FIGS. 13 and 14. Although described in the context of system 100, these platforms may also be used to implement at least portions of other information processing systems in other embodiments, such as systems 200, 900 and 1100.

Figure 13:
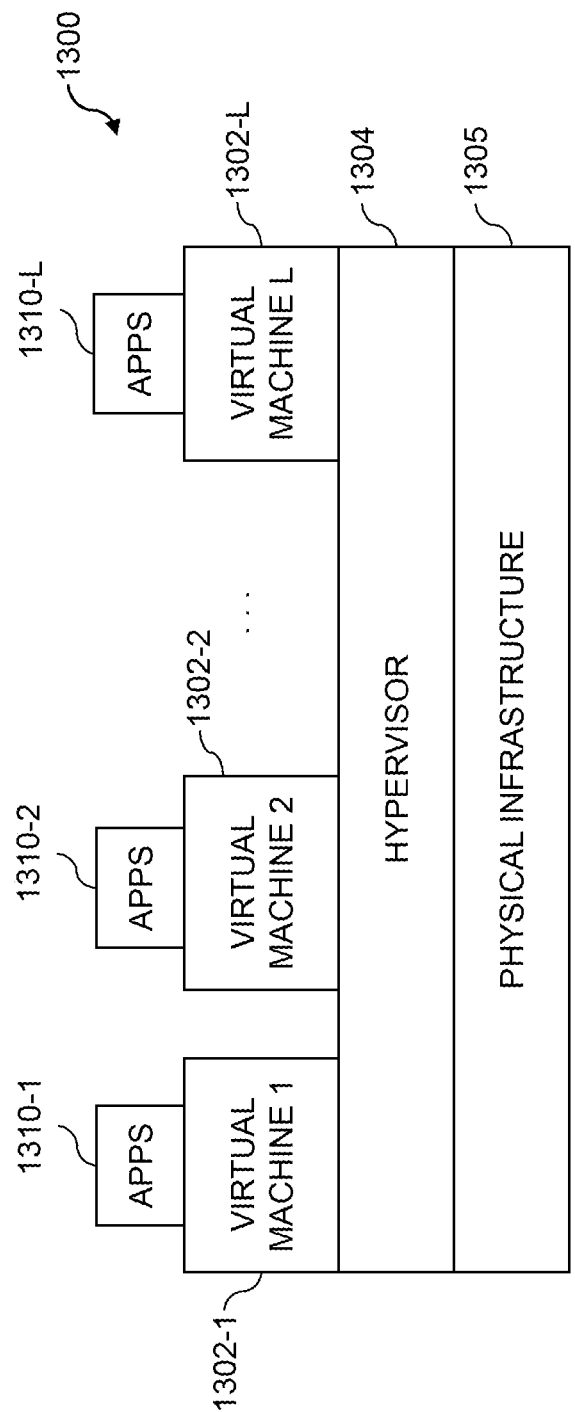
FIGS. 13 and 14 show examples of processing platforms that may be utilized to implement at least a portion of an information processing system in illustrative embodiments.
Figure 14:
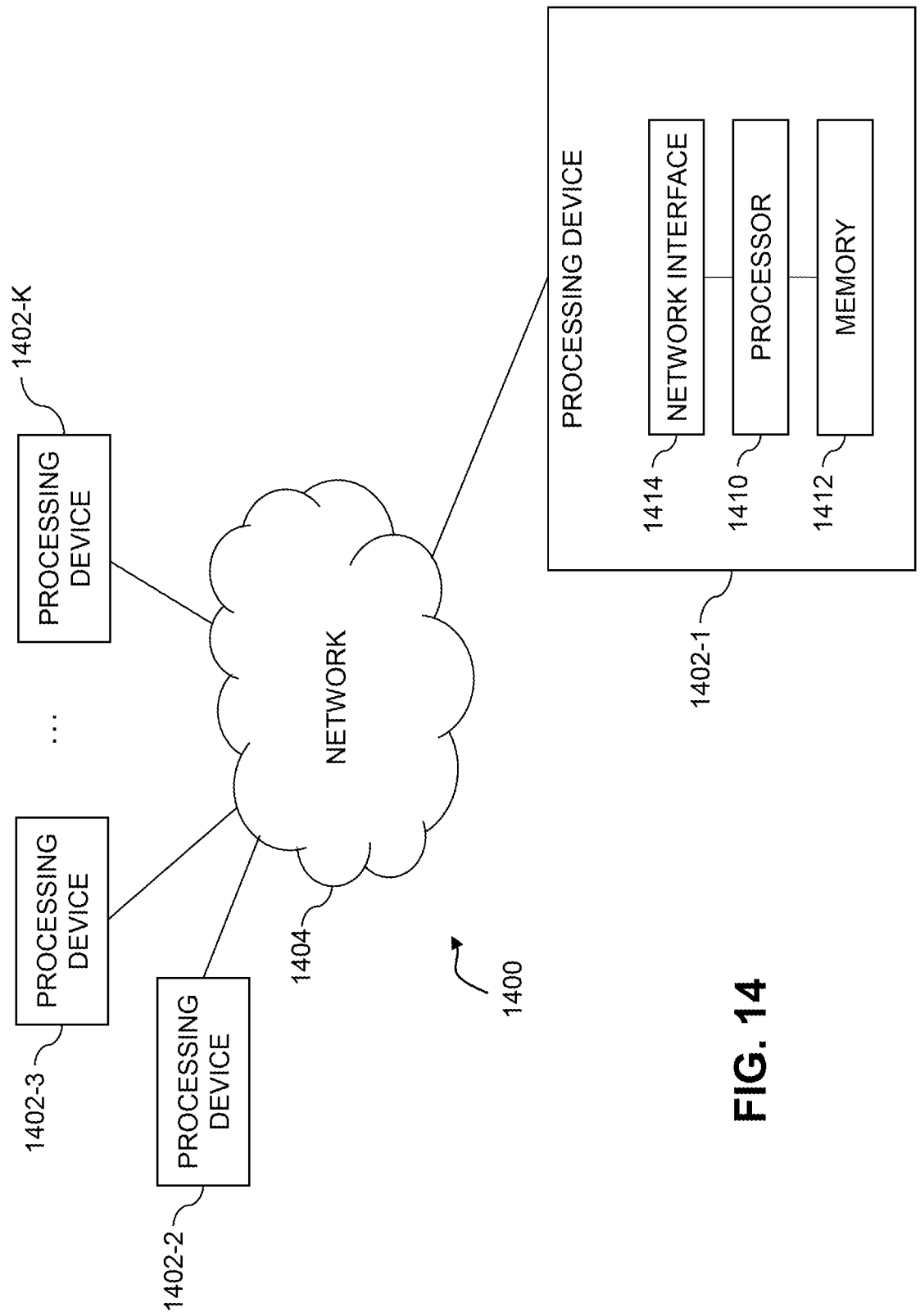

FIG. 13 shows an example processing platform comprising cloud infrastructure 1300. The cloud infrastructure 1300 comprises a combination of physical and virtual processing resources that may be utilized to implement at least a portion of the information processing system 100. The cloud infrastructure 1300 comprises virtual machines (VMs) 1302-1, 1302-2, . . . , 1302-L implemented using a hypervisor 1304. The hypervisor 1304 runs on physical infrastructure 1305. The cloud infrastructure 1300 further comprises sets of applications 1310-1, 1310-2, . . . , 1310-L running on respective ones of the virtual machines 1302-1, 1302-2, . . . , 1302-L under the control of the hypervisor 1304.

Although only a single hypervisor 1304 is shown in the embodiment of FIG. 13, the system 100 may of course include multiple hypervisors each providing a set of virtual machines using at least one underlying physical machine. Different sets of virtual machines provided by one or more hypervisors may be utilized in configuring multiple instances of various components of the system 100.

An example of a commercially available hypervisor platform that may be used to implement hypervisor 1304 and possibly other portions of the information processing system 100 in one or more embodiments is the VMware® vSphere® which may have an associated virtual infrastructure management system such as the VMware® vCenter™. The underlying physical machines may comprise one or more distributed processing platforms that include one or more storage systems.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1300 shown in FIG. 13 may represent at least a portion of one processing platform. Another example of such a processing platform is processing platform 1400 shown in FIG. 14.

The processing platform 1400 in this embodiment comprises a portion of system 100 and includes a plurality of processing devices, denoted 1402-1, 1402-2, 1402-3, . . . 1402-K, which communicate with one another over a network 1404.

The network 1404 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1402-1 in the processing platform 1400 comprises a processor 1410 coupled to a memory 1412.

The processor 1410 may comprise a microprocessor, a microcontroller, an application-specific integrated circuit (ASIC), a field-programmable gate array (FPGA) or other type of processing circuitry, as well as portions or combinations of such circuitry elements.

The memory 1412 may comprise random access memory (RAM), read-only memory (ROM) or other types of memory, in any combination. The memory 1412 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1402-1 is network interface circuitry 1414, which is used to interface the processing device with the network 1404 and other system components, and may comprise conventional transceivers.

The other processing devices 1402 of the processing platform 1400 are assumed to be configured in a manner similar to that shown for processing device 1402-1 in the figure.

Again, the particular processing platform 1400 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxRack™ FLEX, VxBlock™ or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system 100. Such components can communicate with other elements of the information processing system 100 over any type of network or other communication media.

As indicated previously, components of an information processing system as disclosed herein can be implemented at least in part in the form of one or more software programs stored in memory and executed by a processor of a processing device. For example, at least portions of the functionality of one or more components of the data compression systems 120, 140, 1120 and 1140 of systems 100 and 1100 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, source and target sites or storage systems, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
a first storage system comprising a plurality of storage devices;
the first storage system being configured to participate in a replication process with a second storage system;
the first storage system being further configured:
to identify data to be replicated to the second storage system as part of the replication process;
to obtain information characterizing network behavior of at least one network connecting the first storage system to the second storage system;

to select a compression method from a set of available compression methods based on the obtained information characterizing the network behavior of said at least one network;

to compress the data to be replicated to the second storage system utilizing the selected compression method; and to provide the compressed data to the second storage system;

wherein obtaining the information characterizing the network behavior of said at least one network comprises determining a given rank from a hierarchy of ranks, the given rank characterizing at least one of a specified compression rate and a specified compression ratio to utilize for compressing the data to be replicated to the second storage system; and wherein selecting the compression method from the set of available compression methods comprises performing a table look-up in at least one logic table to select a given compression method having at least one of a given compression rate and a given compression ratio corresponding to at least one of the specified compression rate and the specified compression ratio of the given rank.

2. The apparatus of claim 1 wherein the first and second storage systems are associated with respective source and target sites of the replication process and wherein the source site comprises a production site data center and the target site comprises a disaster recovery site data center.

3. The apparatus of claim 1 wherein obtaining the information characterizing the network behavior of said at least one network comprises monitoring a plurality of network metrics of said at least one network.

4. The apparatus of claim 3 wherein the plurality of network metrics are compared with a plurality of network metric thresholds to determine, for at least one of the plurality of network metrics, the given rank from a hierarchy of ranks.

5. The apparatus of claim 4 wherein the plurality of network metrics comprise:

a round trip time (RTT) network metric characterizing a time required for a signal pulse or packet to travel from the first storage system to the second storage system and back again over said at least one network;

a re-transmissions and packet loss network metric characterizing a number of packet re-transmissions required to continue traffic on said at least one network; and a congestion window size network metric characterizing outstanding outbound data from the first storage system for transmission over said at least one network.

6. The apparatus of claim 5 wherein the given rank comprises a highest rank of the hierarchy of ranks having a highest compression ratio when at least one of:

the re-transmission and packet loss network metric indicates that the number of packet-retransmissions exceeds a specified retransmissions threshold; and the RTT metric indicates that the RTT exceeds a specified RTT threshold.

7. The apparatus of claim 5 wherein the given rank comprises a lowest rank of the hierarchy of ranks having a highest compression rate when a current network throughput on said at least one network is less than available bandwidth on said at least one network, the current network throughput being determined based on the congestion window size network metric.

8. The method of claim 5 wherein the given rank comprises one of a successive number of ranks of the hierarchy of ranks associated with successive increased compression rates as the RTT network metric indicates that the RTT exceeds corresponding successive specified RTT thresholds.

9. The apparatus of claim 1 wherein the entries of the at least one logic table are ordered by at least one of compression rate and compression ratio of the available compression methods.

10. The apparatus of claim 1 wherein the entries of the at least one logic table are ordered to correspond to the hierarchy of ranks.

11. The apparatus of claim 1 wherein the set of available compression methods comprise two or more compression methods utilizing different compression algorithms.

12. The apparatus of claim 1 wherein the set of available compression methods comprise:

a first compression method utilizing a given compression algorithm with a first set of configuration parameters; and at least a second compression method utilizing the given compression algorithm with a second set of configuration parameters.

13. The apparatus of claim 1 wherein compressing the data to be replicated to the second storage system utilizing the selected compression method comprises appending a compression header to the compressed data, the compression header identifying the selected compression method.

14. A method comprising:

configuring a first storage system comprising a plurality of storage devices to participate in a replication process with a second storage system; and as part of the replication process, the first storage system:

identifying data to be replicated to the second storage system as part of the replication process;

obtaining information characterizing network behavior of at least one network connecting the first storage system to the second storage system;

selecting a compression method from a set of available compression methods based on the obtained information characterizing the network behavior of said at least one network;

compressing the data to be replicated to the second storage system utilizing the selected compression method; and providing the compressed data to the second storage system;

wherein obtaining the information characterizing the network behavior of said at least one network comprises determining a given rank from a hierarchy of ranks, the given rank characterizing at least one of a specified compression rate and a specified compression ratio to utilize for compressing the data to be replicated to the second storage system;

wherein selecting the compression method from the set of available compression methods comprises performing a table look-up in at least one logic table to select a given compression method having at least one of a given compression rate and a given compression ratio corresponding to at least one of the specified compression rate and the specified compression ratio of the given rank; and wherein the method is implemented by at least one processing device of the first storage system.

15. The method of claim 14 wherein:

obtaining the information characterizing the network behavior of said at least one network comprises monitoring a plurality of network metrics of said at least one network; and the plurality of network metrics are compared with a plurality of network metric thresholds to determine the given rank from a hierarchy of ranks.

16. The method of claim 14 wherein the entries of the at least one logic table being are ordered by at least one of compression rate and compression ratio of the available compression methods.

17. A computer program product comprising a non-transitory processor-readable storage medium having stored therein program code of one or more software programs, wherein the program code when executed by at least one processing device of a first storage system comprising a plurality of storage devices causes the first storage system:
configuring a first storage system comprising a plurality of storage devices to participate in a replication process with a second storage system; and
as part of the replication process, the first storage system:
identifying data to be replicated to the second storage system as part of the replication process;
obtaining information characterizing network behavior of at least one network connecting the first storage system to the second storage system;
selecting a compression method from a set of available compression methods based on the obtained information characterizing the network behavior of said at least one network;
compressing the data to be replicated to the second storage system utilizing the selected compression method; and
providing the compressed data to the second storage system;

wherein obtaining the information characterizing the network behavior of said at least one network comprises determining a given rank from a hierarchy of ranks, the given rank characterizing at least one of a specified compression rate and a specified compression ratio to utilize for compressing the data to be replicated to the second storage system; and
wherein selecting the compression method from the set of available compression methods comprises performing a table look-up in at least one logic table to select a given compression method having at least one of a given compression rate and a given compression ratio corresponding to at least one of the specified compression rate and the specified compression ratio of the given rank.

18. The computer program product of claim 17 wherein:
obtaining the information characterizing the network behavior of said at least one network comprises monitoring a plurality of network metrics of said at least one network; and
the plurality of network metrics are compared with a plurality of network metric thresholds to determine the given rank from a hierarchy of ranks.

19. The computer program product of claim 17 wherein the entries of the at least one logic table are ordered by at least one of compression rate and compression ratio of the available compression methods.

20. The computer program product of claim 17 wherein the entries of the at least one logic table are ordered to correspond to the hierarchy of ranks.

* * * * *